(12) United States Patent
Bhalla et al.

(10) Patent No.: US 10,938,084 B2
(45) Date of Patent: Mar. 2, 2021

(54) COOLING SYSTEM FOR RADIO

(71) Applicant: Intel Corporation, Santa Clara, CA (US)

(72) Inventors: Shallu Bhalla, San Jose, CA (US); Daniel Cox, Hillsboro, OR (US); Bhagyashree S. Ganore, Hillsboro, OR (US); Jesse Melhorn, Keizer, OR (US); Richard Perry, Portland, OR (US); Srinath Reddy Yerakondappagari, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 138 days.

(21) Appl. No.: 16/213,181

(22) Filed: Dec. 7, 2018

(65) Prior Publication Data

US 2020/0185806 A1 Jun. 11, 2020

(51) Int. Cl.
*H01Q 1/32* (2006.01)
*H01Q 1/02* (2006.01)

(52) U.S. Cl.
CPC .............. *H01Q 1/02* (2013.01); *H01Q 1/3275* (2013.01)

(58) Field of Classification Search
CPC ....... H01Q 1/02; H01Q 1/3275; H01L 23/427
See application file for complete search history.

(56) References Cited

U.S. PATENT DOCUMENTS

| | | | |
|---|---|---|---|
| 6,401,805 B1 * | 6/2002 | Wang | H01L 23/427 165/134.1 |
| 7,940,524 B2 | 5/2011 | Rummel et al. | |
| 8,279,604 B2 | 10/2012 | Jones et al. | |
| 8,451,165 B2 | 5/2013 | Puzella et al. | |
| 2016/0380350 A1 | 12/2016 | Elson et al. | |

(Continued)

FOREIGN PATENT DOCUMENTS

WO 2019/016239 A1 1/2019

OTHER PUBLICATIONS

Reichert, C. "Intel and Ericsson 5G connected cars trial attains 1Gbps speeds"; ZDNet, CBS Interactive; Article [online]. Nov. 7, 2017 [retrieved Dec. 14, 2019]. Retrieved from the Internet: <URL: https://www.zdnet.com/article/intel-and-ericsson-5g-connected-cars-trial attains-1gbps-speed/>; entire document.

(Continued)

*Primary Examiner* — Daniel Munoz
(74) *Attorney, Agent, or Firm* — Schiff Hardin LLP

(57) ABSTRACT

Techniques are disclosed to remedy thermal issues associated with antenna systems. These techniques include implementing heat pipes coupled between an external mast having antenna circuitry mounted thereon and an internal heatsink inside an environmentally-controlled location. This configuration thermally regulates heat associated with active antennas mounted to the mast, which is externally mounted onto the roof of a vehicle. The heat pipes carry heat from the mast down through the roof to the internal heatsink. The aspects described herein allow for car manufacturers to integrate mmWave technology into their vehicles while avoiding large and unsightly cooling mechanisms that would otherwise adversely impact aerodynamics and fuel efficiency.

20 Claims, 10 Drawing Sheets

(9 of 10 Drawing Sheet(s) Filed in Color)

(56) References Cited

U.S. PATENT DOCUMENTS

2017/0136959 A1* 5/2017 Denny ................. G07C 5/0866
2019/0097299 A1* 3/2019 Fotheringham .......... H01Q 1/02
2019/0312342 A1* 10/2019 Sautter .................... H01Q 1/02

OTHER PUBLICATIONS

Ganore, B. et al. "Impact of Solar Radiation on the Thermal Design of Outdoor Enclosures for 5G Devices in Automotive Transmission Platform with Thermal Risk Analysis"; 18th IEEE !THERM; Conference [online]. May 28-31, 2019 [retrieved Dec. 13, 2019). Retrieved from the Internet: <URL: https://ieeexplore.ieee.org/documenV8757288>; entire document.
Search Report dated Dec. 16, 2019 for International Application No. PCT/US19/56427.

\* cited by examiner

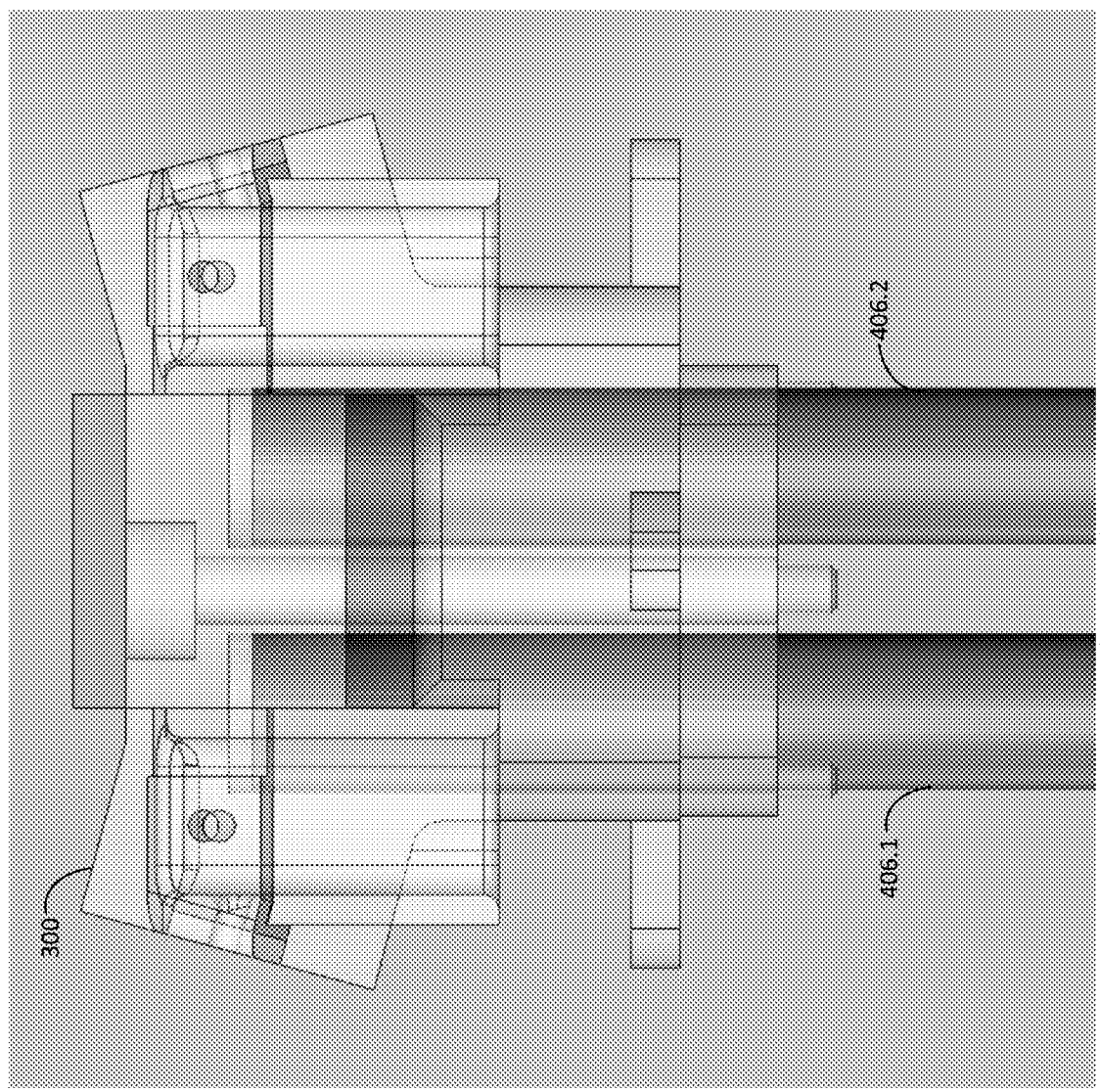

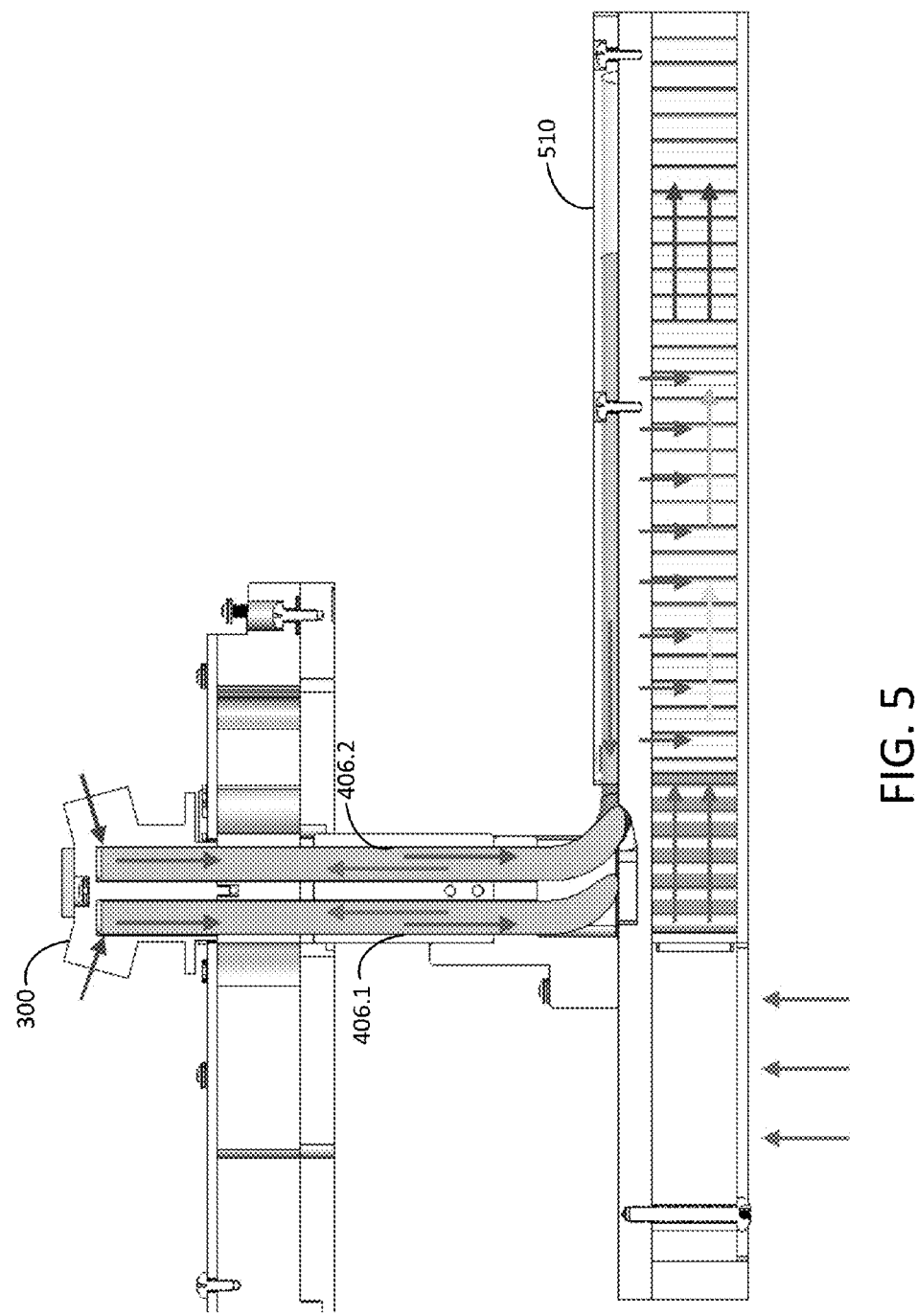

US 10,938,084 B2

COOLING SYSTEM FOR RADIO

TECHNICAL FIELD

Aspects described herein generally relate to cooling solutions for radios and, more particularly, to cooling solutions for active radio systems that operate outside of environmentally-controlled conditions.

BACKGROUND

Active roof-mounted antennas need to withstand a combined thermal load from hot ambient air, direct sunlight, and heat generated by the active antenna itself (e.g., heat generated via integrated power amplifiers (PAs)). Moreover, millimeter (mm) wave radios require that the active antenna chip, which is coupled to the mm wave antenna to manage signal handing, be in close physical proximity to the antenna, meaning the chip will also be subjected to these adverse thermal conditions. Further complicating this issue, mm wave chips have stricter junction temperature ($T_j$) requirements and worse PA efficiency compared to other types of radio chips. When taken in combination, these factors create a situation in which a mm wave chip must remain relatively cool while being subjected to significant thermal loading from multiple sources.

BRIEF DESCRIPTION OF THE DRAWINGS/FIGURES

The patent or application file contains at least one drawing executed in color. Copies of this patent or patent application publication with color drawing(s) will be provided by the Office upon request and payment of the necessary fee.

The accompanying drawings, which are incorporated herein and form a part of the specification, illustrate the aspects of the present disclosure and, together with the description, further serve to explain the principles of the aspects and to enable a person skilled in the pertinent art to make and use the aspects.

FIG. 1 illustrates a block diagram of an example active antenna cooling solution, in accordance with an aspect of the disclosure.

FIGS. 2A-B illustrate three-dimensional (3-D) diagrams of an example active antenna cooling solution, in accordance with an aspect of the disclosure.

FIGS. 3A-B illustrate 3-D diagrams of an example mast structure, in accordance with an aspect of the disclosure.

FIGS. 4A-B illustrate 3-D diagrams of an example mast structure showing heat pipe routing, in accordance with an aspect of the disclosure.

FIG. 5 illustrates a block diagram indicating heat transfer associated with of an example active antenna cooling solution, in accordance with an aspect of the disclosure.

The exemplary aspects of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Again, typical mm wave (also referred to herein as "mmWave") radios have strict thermal requirements with regards to the mmWave radio chips used within the system, and this problem is further compounded for roof-mounted automotive applications. Traditional roof-mounted antenna systems implementing antennas for FM, AM, GPS, cellular, etc., do not require intricate thermal solutions because they have more relaxed junction temperature limits, better PA efficiency than mmWave radio chips, and do not require the heat-producing chips to be close to the antennas (e.g., the heat-producing chips may be in an environmentally-controlled location and coupled to the antennas via cabling). Moreover, conventional automotive radio thermal solutions are not designed to dissipate heat at the antenna.

Thus, to remedy the thermal issues associated with mmWave antenna systems, the aspects described herein are directed to a thermal solution implementing heat pipes to remove heat from an active mmWave antenna. As shown and discussed herein, the active mmWave antennas are mounted inside a typical "shark fin" enclosure mounted to the roof of a vehicle. As further discussed below, the heat pipes carry heat down through the roof to a heat exchanger inside the cab, which is assumed to be environmentally-controlled region compared to the conditions outside the cab to which the mmWave chip and active antennas may be exposed.

In doing so, the aspects described herein allow for the heatsink to be relatively small and hidden within a vehicle, as aesthetics are of particular importance in the car manufacturing industry. This aspects described herein thus allow for car manufacturers to integrate mmWave technology into their vehicles while avoiding large and unsightly cooling mechanisms that would otherwise adversely impact aerodynamics and fuel efficiency. In doing so, the aspects provide for a cooling mechanism that allows mmWave radio operation at optimal temperatures and in worst-case weather conditions without requiring a car manufacturer to place a large heatsink on the exterior surface of the vehicle.

Figure 1:
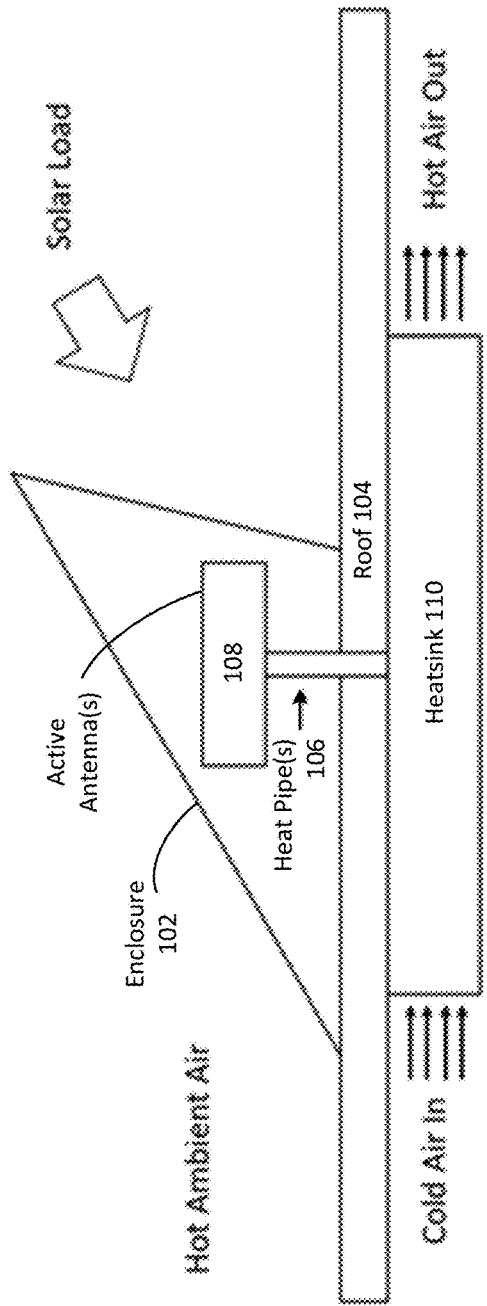

FIG. 1 illustrates a block diagram of an example active antenna cooling solution, in accordance with an aspect of the disclosure. The active antenna cooling system 100 as shown in FIG. 1 may generally include an enclosure 102, a roof 104, one or more heat pipes 106, one or more active antennas 108, and a heatsink 110 (e.g., a heat exchanger). As shown in FIG. 1, the enclosure 102 may be disposed over the active antenna(s) 108 and heat pipe(s) 106 such that these components are fully enclosed and protected. The enclosure 102 may be of any suitable size and shape, and may be mounted to the roof 104 using any suitable fastening systems such as sealants, gaskets, fasteners, etc. Moreover, the enclosure 102 may be function as a radome for the antenna(s) 108, and thus be composed of any suitable materials sufficient for this purpose (e.g., radio frequency (RF) transparent or nearly RF transparent materials at the desired operating wavelength of the active antenna(s) 108, a polymer material, etc.).

As shown in FIG. 1, the active antenna(s) 108 may be thermally and physically coupled to one or more heat pipe(s) 106, which are in turn thermally and physically coupled to the heatsink 110 through the roof 104. In this configuration, the heatsink 110 is located on the underside of the roof 104, which may be associated with any suitable type of object separating an external environment from an internal environment, which is at least partially sealed from the external environment and environmentally-controlled in some manner. For example, although the roof 104 is illustrated and discussed herein in the context of an automobile, this is by way of example and not limitation. For instance, the roof 104 may be associated with an automobile, an aircraft, a truck, an environmentally-controlled trailer or mobile home, a permanent dwelling or office, or any other fixed structure, etc. Moreover, aspects include the roof 104 alternatively being associated with any suitable type of divider between the external environment and the internal environment. For example, the roof 104 may also be identified with a window pane or any other suitable partition between two different environments.

As further discussed below, the active antenna(s) 108 may be implemented as any suitable number and/or type of active antennas, such as the aforementioned mmWave frequencies of operation, for example. In various aspects, the active antenna(s) 108 may be implemented as any suitable type of circuitry such as, for instance, one or more individually-integrated antenna modules and/or or chips configured to transmit and/or receive wireless signals in accordance with any suitable communication protocol, which may cover one or more frequencies or frequency bands. For example, the antenna(s) 108 may be implemented as antenna modules, integrated circuits, or chips designed to operate in accordance with the mmWave frequency spectrum, which may include sub-6 GHz bands and/or frequencies greater than sub-6 GHz, such as within a range of 24-86 GHz. The operation of the antenna(s) 108 are provided as examples and not by way of limitation. For instance, the aspects described herein are not limited to mmWave operation or the frequency spectrum defined in accordance with mmWave operation at the time of this writing. Instead, the aspects as described herein may be implemented for any suitable number of antennas, as well as antennas of any suitable type, including both passive and active antennas, to advantageously leverage the cooling solutions as described herein.

With further reference to FIG. 1, the heatsink 110 is mounted within an environmentally-controlled region (e.g., an air-conditioned interior of a vehicle), whereas the active antennas and enclosure are mounted on top of the roof 104. As a result, the active antenna(s) 108, which are coupled to antenna chips or modules (not shown), and the enclosure 102, are subjected to hot ambient air and solar loading, whereas the heatsink 110 is not. Although referred to herein as a "heatsink," the heatsink 110 may be implemented as any suitable type of heat exchanger or other device suitable for facilitating heat transfer, with or without fins, and having any suitable type of shape and composition (e.g., aluminum) to ensure efficient thermal exchange with the heat pipe(s) 106. For example, the heatsink 110 may include one or more fans to facilitate the flow of air through the heatsink 110, allowing heated vapor caused by the antenna(s) 108 to be appropriately cooled and condensed back into a cooled, liquid form before being routed back to the antenna(s) 108 in a circulating manner.

In various aspects, the heat pipe(s) 106 may be implemented as any suitable number of heat pipes comprised of any suitable type of material and filled with any suitable type of working fluid to ensure proper cooling of the antenna(s) 108. For example, the heat pipe(s) 106 may be implemented using copper or aluminum with a working fluid including ammonia, methanol, ethanol, water, etc. In various aspects, the heat pipe(s) 106 may work in conjunction with the heatsink 110 in a passive or active manner. For example, although not shown in FIG. 1, the heat pipe(s) 106 may work with various pumps and/or other regulators to allow the appropriate level of flow and thermal exchange with the heatsink 110. To provide some illustrative examples, the heat pipes(s) 106 may be implemented as constant conductance heat pipes (CCHPs), vapor chambers (planar heat pipes), variable conductance heat pipes (VCHPs), pressure controlled heat Pipes (PCHPs), diode heat pipes, thermosyphons, rotating heat pipes, etc.

Figure 2A:
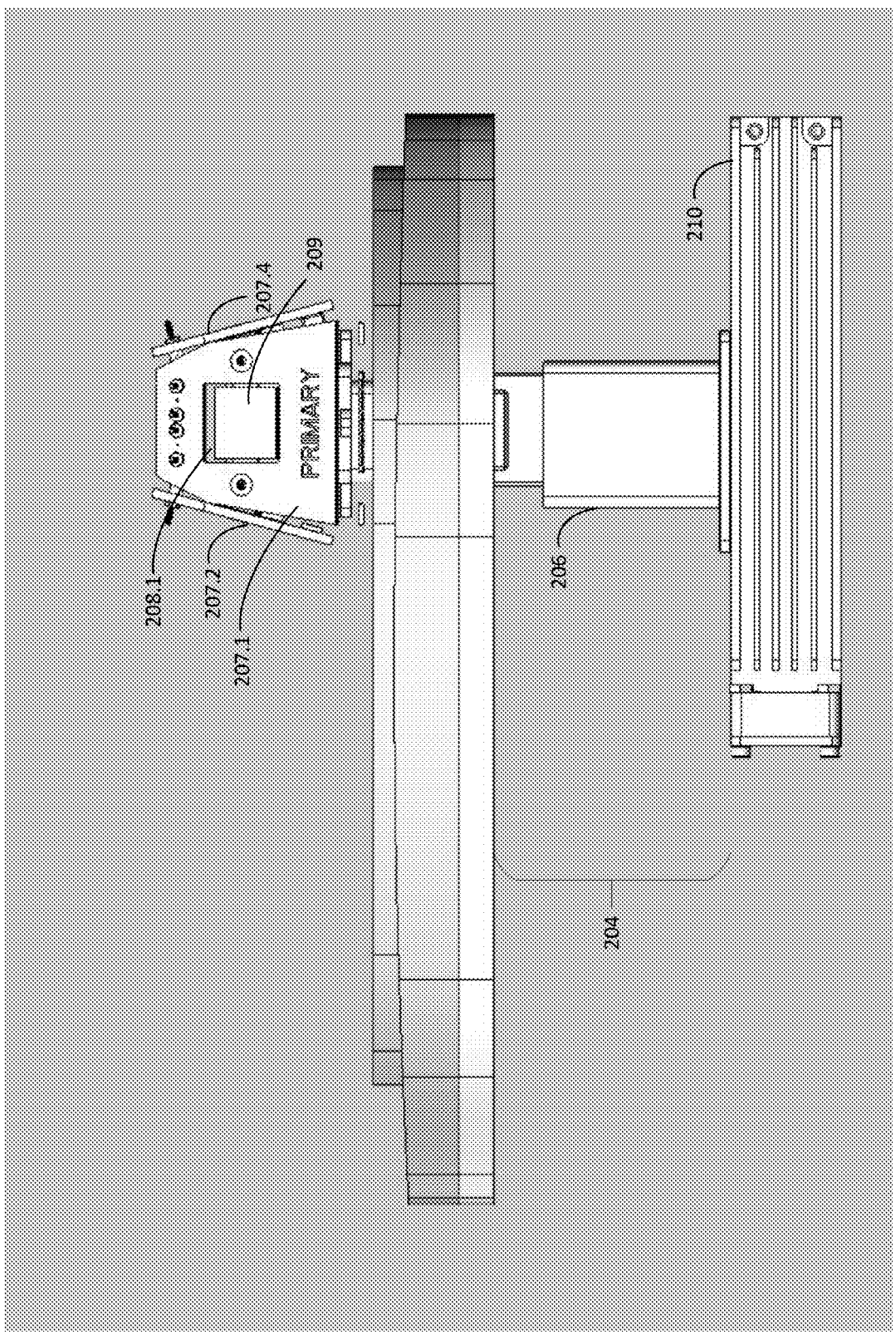
Figure 2B:
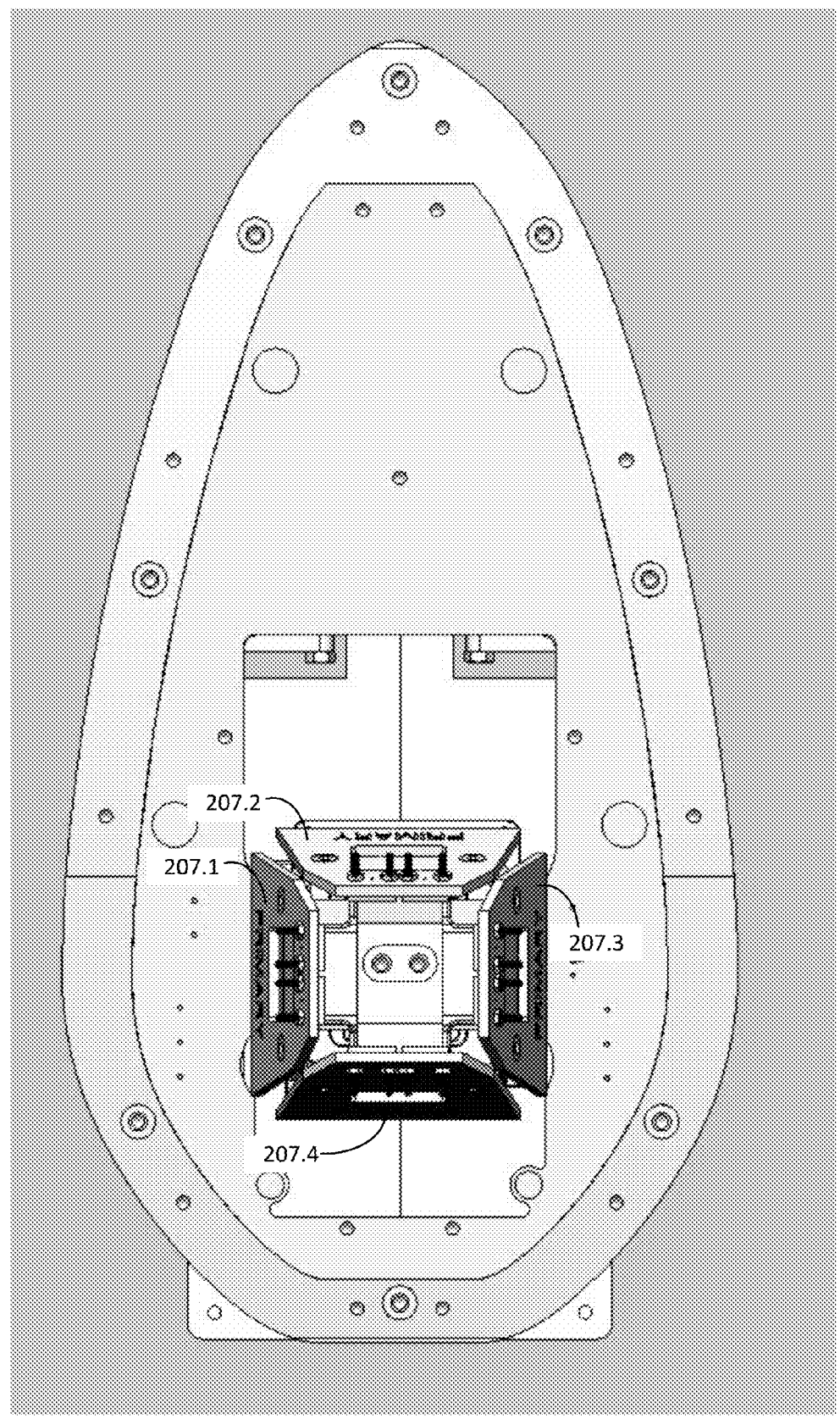

FIGS. 2A-B illustrate three-dimensional (3-D) diagrams of an example active antenna cooling solution, in accordance with an aspect of the disclosure. FIG. 2A represents a side view of the active antenna cooling system 200, whereas FIG. 2B represents a top view of the active antenna cooling system 200. Several portions of the active antenna cooling system 200 as shown in FIGS. 2A-B may be identified with those shown in FIG. 1, with others removed for additional clarity. For example, the active antenna cooling system 200 has the enclosure 102 as shown in FIG. 1 removed. Furthermore, the active antenna cooling system 200 shown in FIGS. 2A-B includes a heatsink 210 that may be identified with the heatsink 110 as shown in FIG. 1. The active antenna cooling system 200 additionally illustrates a portion 206 that encloses the heat pipe(s) 106 as shown in FIG. 1, and the section 204 that may be identified with the roof 104 as shown in FIG. 1, although the roofing material is also omitted from FIGS. 2A-2B for clarity. Thus, the active antenna cooling system 200 may be mounted within a vehicle, for example, such that the heatsink 210 is below the roof line and within the environmentally-controlled cab.

The active antenna cooling system 200 as shown in FIGS. 2A-B further illustrates additional detail associated with the active antenna(s) 108, as shown in FIG. 1. As shown in each of FIGS. 2A-2B, the active antenna cooling system 200 includes a mast 209 that is associated with one or more active antennas, which are not shown in FIGS. 2A-B for clarity. Again, these active antennas may be, for example, single chip designs with various active antenna components integrated therein such as radiating elements, one or more PAs, etc. Aspects include each active antenna chip being mounted to each of the respective antenna boards 207.1-207.4 as shown in FIGS. 2A-B. Thus, each active antenna chip, in this example, may be associated with a quadrant of space to ensure full spatial coverage. Each active antenna chip may be mounted to a respective board 207.1-207.4 such that a portion of each active chip antenna comes into thermal contact with a portion of the mast 209 via each cutout 208.1-208.4, as further discussed herein. For instance, the mast 209 may conduct heat from each active chip antenna via each active antenna's receptive silicon package, which is not shown for purposes of brevity. To provide another example, an active antenna chip may be formed with a plastic overmold, and the mast 209 conducts heat thru the active antenna chip via this portion using a thermal interface material (TIM) at the contacting surface to ensure the proper heat transfer. In any event, each cutout 208.1-208.4 may thus be associated with a respective antenna board 207.1-207.4 as shown in the FIGS. 2A-B.

Figure 3A:
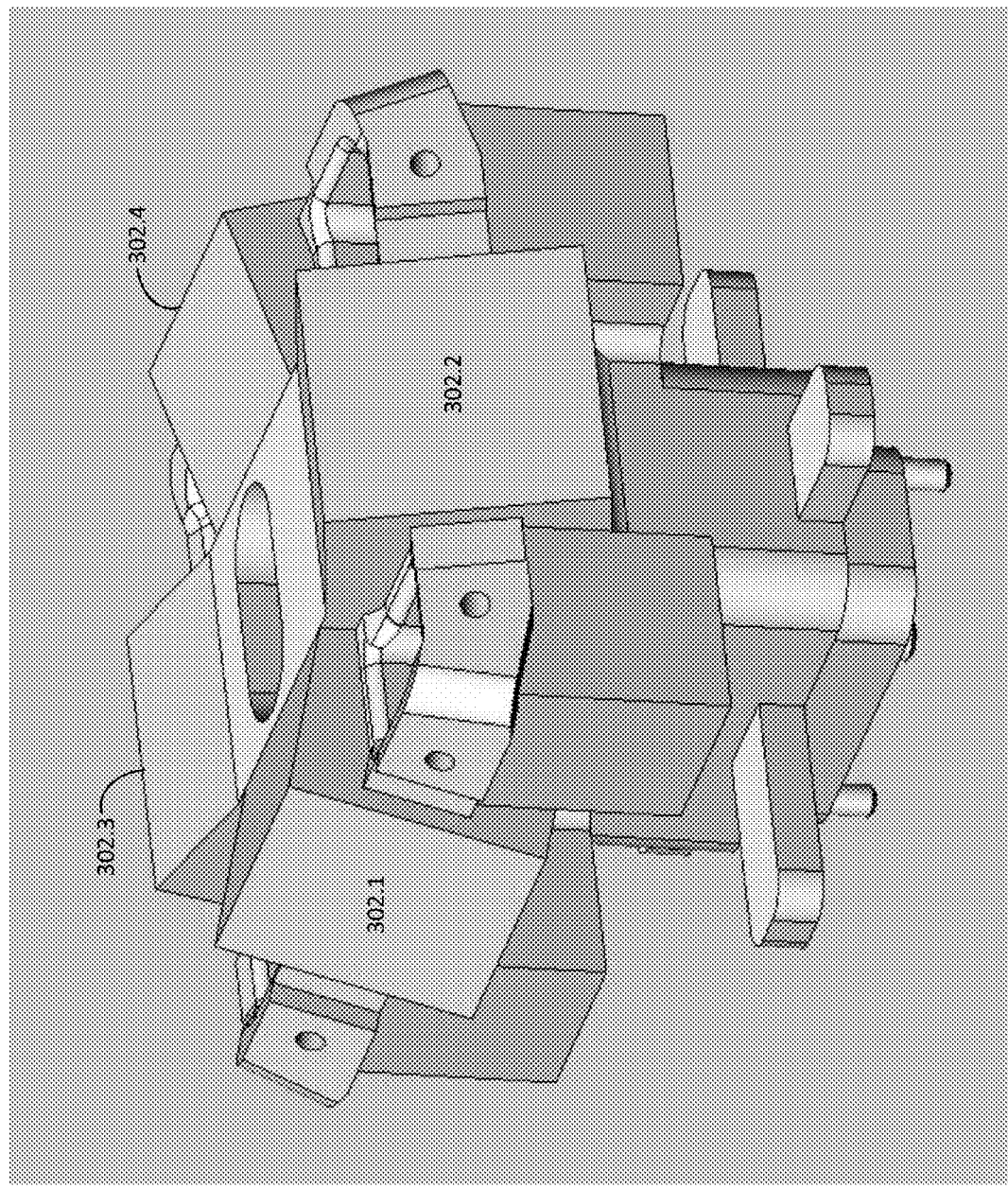
Figure 3B:
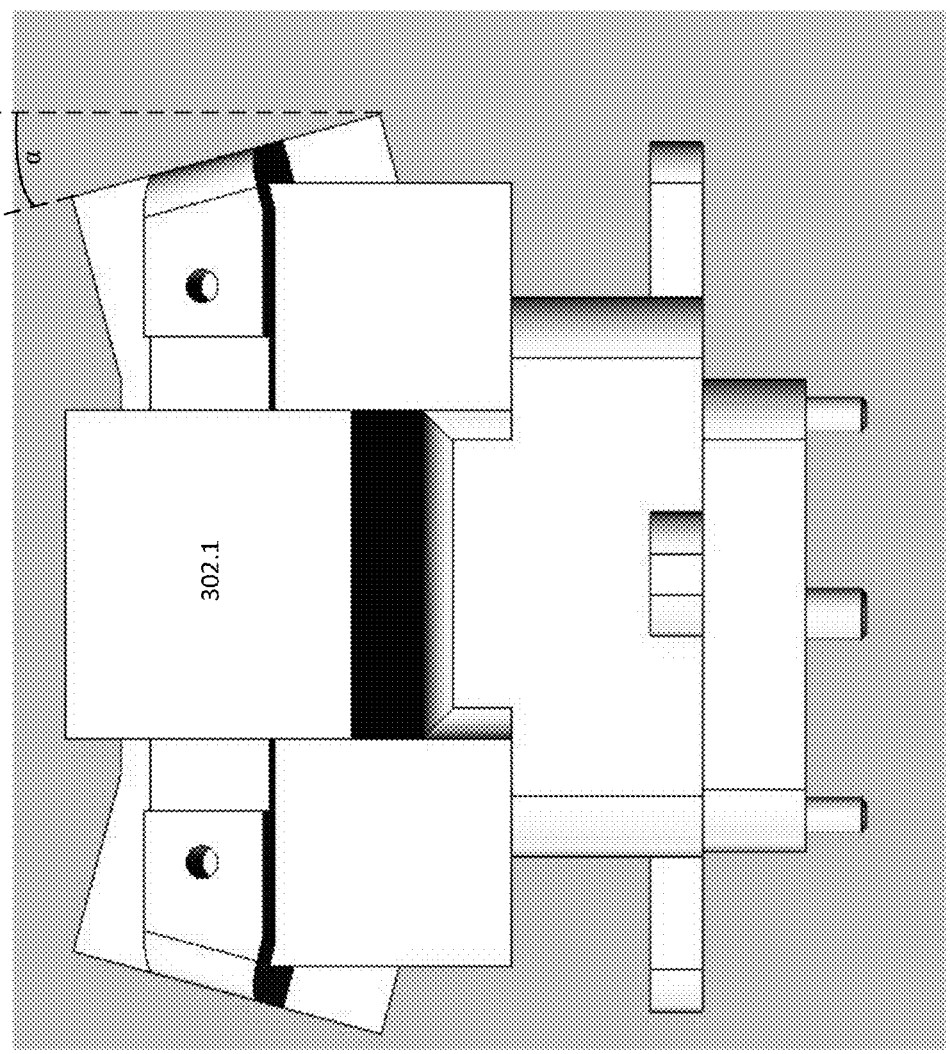

FIGS. 3A-B illustrate 3-D diagrams of an example mast structure, in accordance with an aspect of the disclosure. FIG. 3A represents an isometric view of a mast 300 used in accordance with the active antenna cooling system 200, whereas FIG. 3B represents a side view of the mast 300. The mast 300 as shown in FIGS. 3A-B may be identified with, for example, the mast 209, as shown in FIGS. 2A-B.

Although referred to herein as a "mast," this structure may be implemented as any suitable type of device suitable for facilitating heat transfer between the active antenna chips and the heat pipes. The mast structure may or may not include fins, and may have any suitable type of shape and composition (e.g., aluminum) to ensure efficient thermal exchange with the heat pipe(s), as discussed herein. For example, in the examples shown in FIGS. 3A-B and 4A-B and further discussed below, the mast 300 may be implemented as a "cold plate" or "cold block." In any event, the mast 300 functions to remove heat from the active antenna chips by transferring this heat to the heat pipes, which then carry the heat to the remote heat exchanger (e.g., the heatsink 110 as shown in FIG. 1).

In an aspect, the mast 300 may be comprised of any suitable type of metal (e.g., aluminum) and be machined from a solid piece of metal having a "tree" or "branching" structure, with each branch corresponding to a different active chip antenna as shown in FIGS. 2A-B. In the example discussed herein, four active chip antennas are used, although this is by way of example and not limitation. Therefore, although the mast 300 is shown and described herein having four braches for a four antenna system, aspects include the mast 300 being modified to mate with any suitable number of antenna chips. Continuing the example shown in FIGS. 2A-B, the mast 300 is likewise shown having four branches, each having a respective face 302.1-302.4 that is arranged to make thermal contact with a metallic portion of each active chip antenna designed for such a thermal interface. For example, each face 302.1-302.4 as shown in FIG. 3A may align with a respective cutout (e.g., cutout 208.1) that is present in each antenna board 207.1-207.4, as shown in FIG. 2A, for example, and a thermal gap pad or thermal paste (e.g., the aforementioned TIM, not shown) may be applied between each face 302.1-302.4 and a respective active chip antenna mounted thereon.

In various aspects, to ensure proper RF and beamforming performance, it may be preferable to mount each of the active antenna chips to each respective antenna board 207.1-207.4 to form various angles with respect to the roof of the vehicle and/or the horizontal plane. For example, in some aspects, each face may form a 90-degree angle with the horizontal such that α=0 degrees, whereas other aspects include each face forming other angles with respect to the vertical such as α=5 degrees, 10 degrees, 15 degrees, etc. In various aspects, each face 302.1-302.4 may form the same angle α or different angles α with respect to one another. In an aspect, the mast 300 includes four faces 302.1-302.4, each forming an angle α of 15 degrees as shown in FIG. 3B. Continuing this example, the antenna boards 207.1-207.4 may be mounted parallel with each face 302.1-302.4 such that the antenna boards 207.1-207.4 (and their respectively mounted active antenna chips) likewise form the same 15 degree angle with respect to the vertical. It should be noted that "horizontal" in this context refers to a plane substantially parallel with the horizon or the roof of the vehicle, whereas "vertical" refers to the perpendicular direction thereto.

Figure 4B:
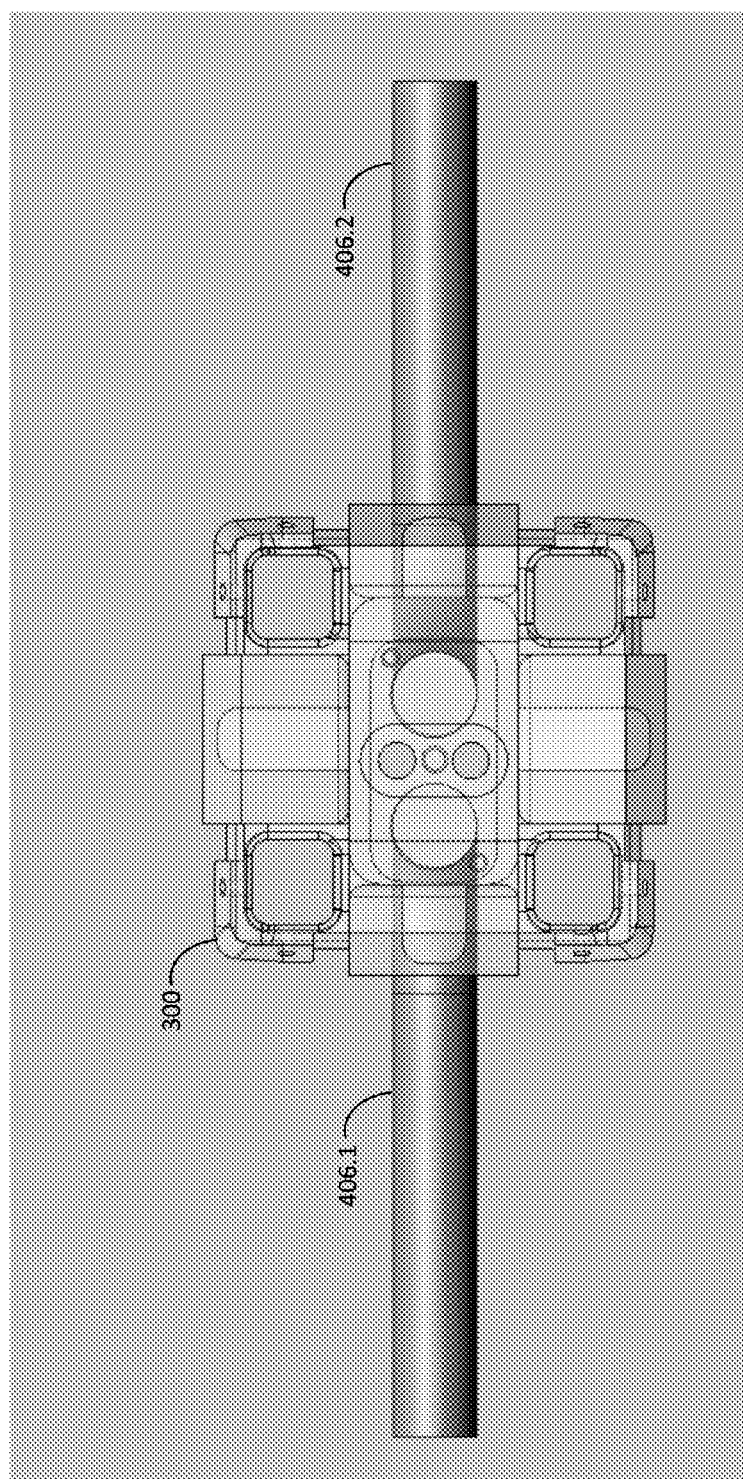

FIGS. 4A-B illustrate 3-D diagrams of an example mast structure showing heat pipe routing, in accordance with an aspect of the disclosure. FIG. 4A illustrates an example diagram of a side view of the mast structure showing heat pipe routing, in accordance with an aspect of the disclosure. In various aspects, the mast 300 as shown in FIGS. 3A-B may be machined to mate with and make thermal contact with any suitable number of heat pipes. For example, as shown in FIG. 4A, the mast structure 400 includes the mast 300 as discussed with respect to FIGS. 3A-B, which is shown as mating with two heat pipes 406.1, 406.2. The heat pipes 406.1, 406.2 may be identified with, for example, the heat pipe(s) 106 as shown in FIG. 1, in various aspects.

FIG. 4B illustrates an example diagram of a top view of the mast structure showing heat pipe routing, in accordance with an aspect of the disclosure. As shown in FIG. 4B, the heat pipes 406.1, 406.2 are shown being routed to a heatsink, such as the heatsink 110, for example, as discussed herein with reference to FIG. 1, although this heatsink is not shown in FIGS. 4A-B for purposes of clarity. The heat pipe routing shown with respect to FIGS. 4A-B is by way of example, and the heat pipes implemented via the active antenna cooling system as discussed herein may utilize any suitable routing between the active chip antennas (i.e., the external mast) and the heatsink that is located within an environmentally controlled area (i.e., the internal heatsink). Additional details regarding the overall heat transfer within an active antenna cooling system are further discussed below.

FIG. 5 illustrates a block diagram indicating heat transfer, in accordance with an aspect of the disclosure. The active antenna cooling system 500 may be identified with, for instance, the active antenna cooling systems 100, 200, as shown in FIGS. 1 and 2A-B. The mast 300 is shown at the top of the diagram in FIG. 5 as being coupled to the two heat pipes 406.1, 406.2. The heatsink 510 may also be identified with, for example, the heatsinks 110, 210 as shown and discussed with respect to FIGS. 1 and 2A-B. Thus, as the active antennas and solar loading generate heat in the mast 300, a phase change occurs in the working fluid, turning it into a vapor form. The vapor is then carried through the heat pipes 406.1, 406.2 to the heatsink 510 (e.g., as shown by the red arrows within the heat pipes 406.1, 406.2), which is disposed within an environmentally-controlled region such as a vehicle cab, for instance. In an aspect, the heatsink 510 may include one or more fans, which blow relatively cool air (i.e., air having a temperature similar to the ambient air temperature within the cab). This, in turn, cools the working fluid, causing another phase change that condenses the working fluid back into a fluid form (e.g., as shown by the blue arrows within the heat pipes 406.1, 406.2), where it is recirculated to the mast 300, repeating the overall thermal flow process. In this way, because the heatsink 510 is located in an environmentally-controlled region compared to the mast 300, the heatsink 510 dissipates heat more efficiently than if the heatsink 510 were outside or in an uncontrolled environment.

In an aspect, the heatsink 510 may include fans that are controlled via a thermal regulation system. For example, the heatsink 510 may include one or more fans that are powered via DC power provided by the vehicle in which the active antenna cooling system 500 is implemented. Continuing this example, the active antenna cooling system 500 may also directly monitor the junction temperature $T_j$ of each (or an average of each) active antenna chip (not shown). To provide another example, the active antenna cooling system 500 may also include one or more calibrated thermal monitoring locations (not shown), which provide a tracked offset or shifted temperature with respect to the junction temperature $T_j$ of each (or an average of each) active antenna. For example, each of the antenna boards 207.1-207.4 as discussed with reference to FIGS. 2A-B may include a calibrated thermal monitoring location that indicates the junction temperature $T_j$ of each active antenna chip shifted by some number of degrees. In an aspect, this calibrated temperature may be monitored and used as feedback in lieu of directly monitoring the junction temperature $T_j$ at each active antenna chip. This feedback may then be utilized to establish set points for a thermal regulation system to turn fans associated with the heatsink 510 off and on as desired to suitably regulate the temperature of the heatsink 510. As a result, the junction temperature $T_j$ of each active antenna chip of each active antenna chip may be maintained below an established or predetermined threshold (e.g., a temperature threshold known to be within a safe operating limit).

Figure 6A:
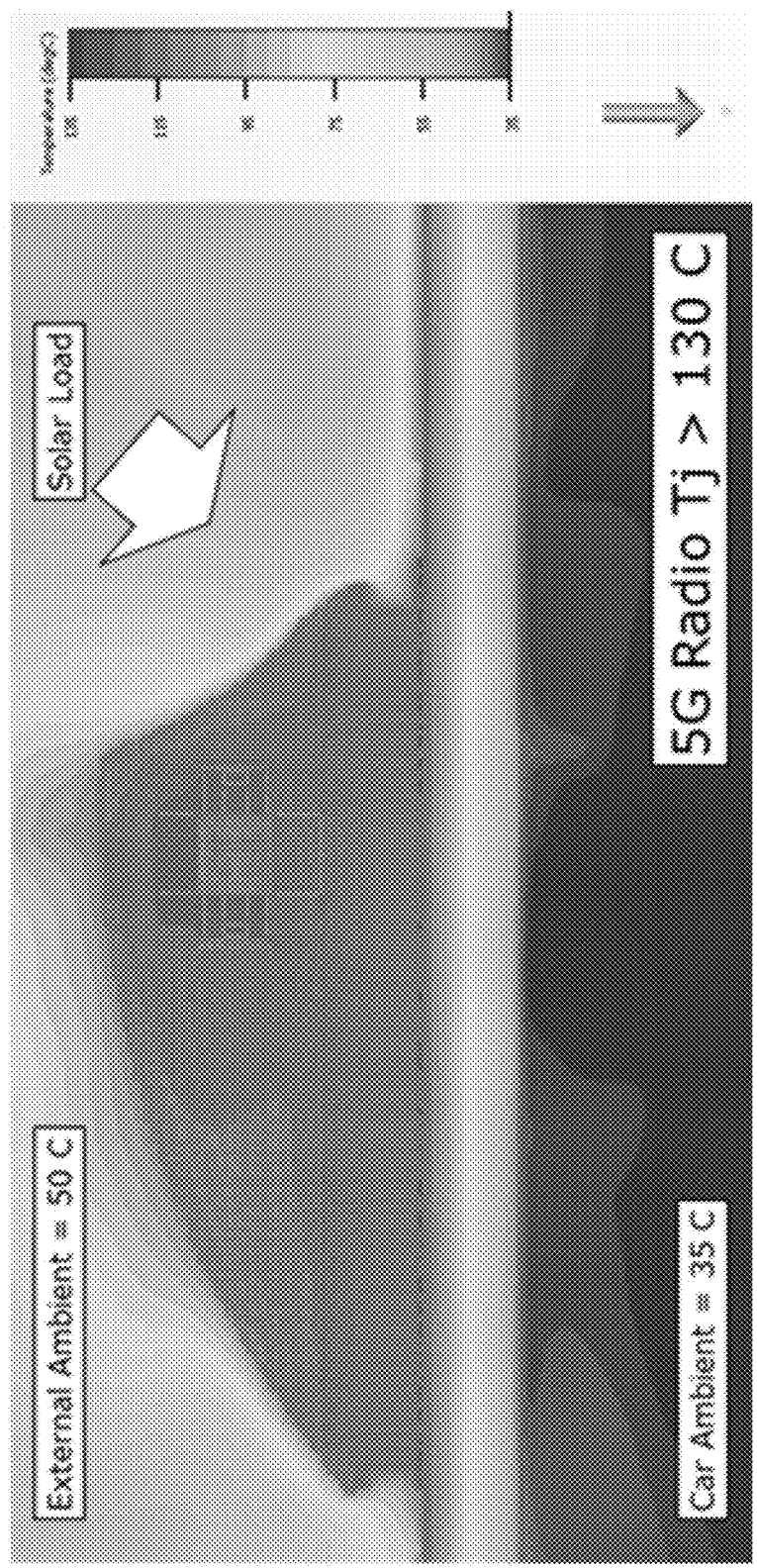
FIG. 6A illustrates a thermal simulation for an active antenna system without using the active antenna cooling aspects as described herein, in accordance with an aspect of the disclosure.

FIG. 6A illustrates a thermal simulation for an active antenna system without using the active antenna cooling aspects as described herein, in accordance with an aspect of the disclosure. The thermal simulation 600 as shown in FIG. 6A corresponds to a thermal simulation for a mmWave active antenna system mounted to the roof of a vehicle without the heat pipe and heatsink system described herein. In other words, thermal simulation 600 as shown in FIG. 6A shows the typical use of a mmWave radio system with passive cooling of the mast 300 only, i.e., without using the separate, environmentally-controlled heatsink structure that is included within the cab of the vehicle. As shown in FIG. 6A, the thermal simulation 600 suggests that, without the solutions described herein, the junction temperature $T_j$ of a mmWave active antenna chip mounted inside a shark fin enclosure could exceed the optimal performance temperature by more than 50° C. in worst-case conditions. These "worst-case" conditions were defined as 50° C. external ambient air, 35° C. internal ambient air, direct sunlight, no wind on the shark fin enclosure, and active mmWave data traffic.

Figure 6B:
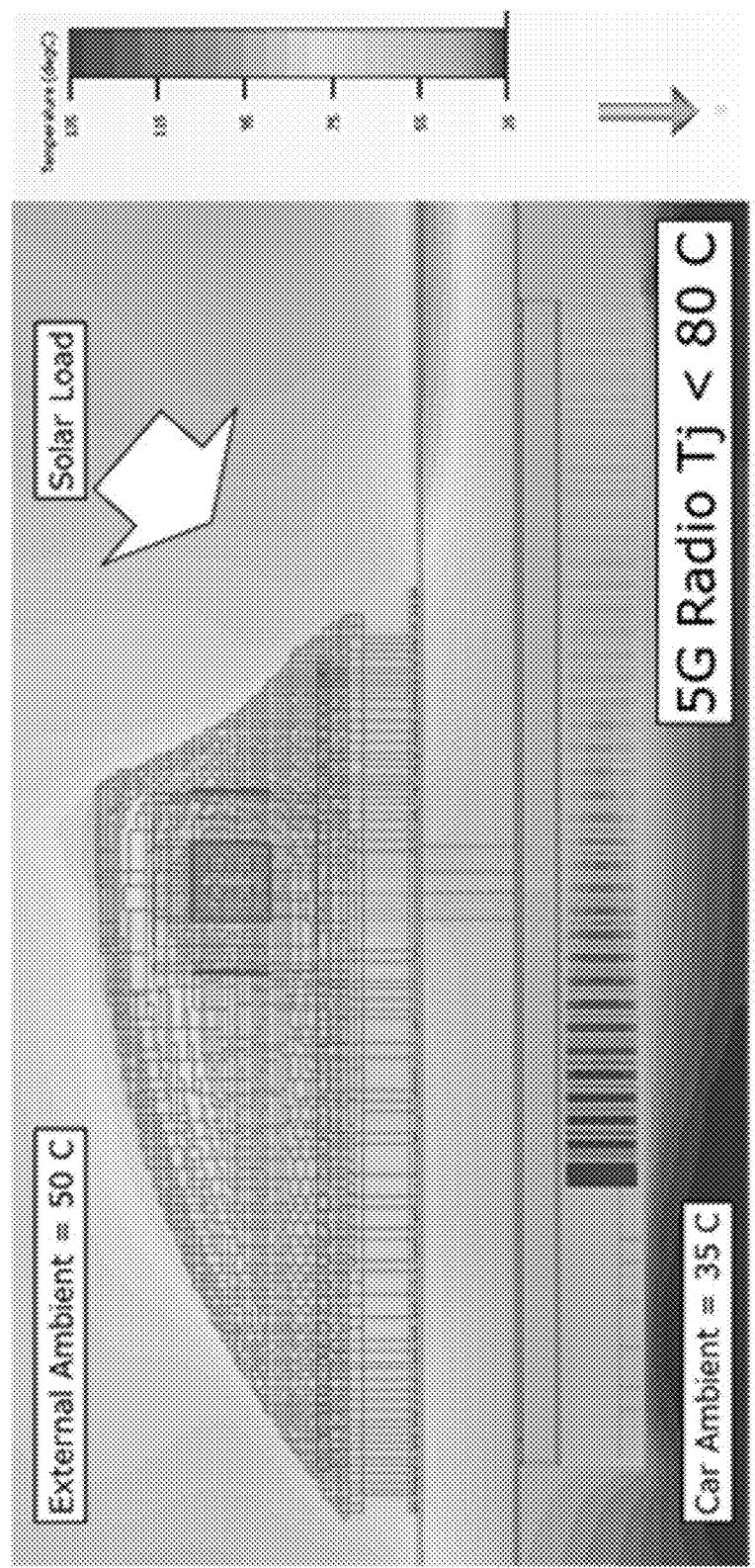
FIG. 6B illustrates a thermal simulation for an active antenna system using the active antenna cooling aspects as described herein, in accordance with an aspect of the disclosure.

In contrast, FIG. 6B illustrates a thermal simulation for an active antenna system using the active antenna cooling aspects as described herein, in accordance with an aspect of the disclosure. The thermal simulation 650 as shown in FIG. 6B corresponds to a thermal simulation for a mmWave active antenna system mounted to the roof of a vehicle using the heat pipe and heatsink system described herein. In other words, thermal simulation 650 as shown in FIG. 6B shows the typical use of a mmWave radio system when the active antenna cooling system as discussed, for instance, with respect to FIGS. 1-5, is implemented.

Comparing the thermal simulation data 600, 650, it can be observed that the mmWave antenna and, in particular, the junction temperature $T_j$ of a mmWave active antenna chip mounted inside a shark fin enclosure, is much hotter for the passive solution versus solutions implementing the aspects described herein. This is because a thermal solution small enough to fit entirely inside a typical shark fin enclosure is too small to dissipate a sufficient amount of heat in the worst-case conditions. Thus, as can be seen from FIGS. 6A-B, cooling the mmWave active antenna chip to its optimal junction temperature otherwise requires a large heatsink on top of the roof, necessitating a large and unaesthetic design that would deter potential customers. Alternatively, a smaller and more efficient heatsink may be implemented under the roof to leverage an environmentally-controlled heatsink. The heat pipe arrangement discussed herein therefore allows for a flexible separation of the heat source and heatsink, which in turn allows a car manufacturer to avoid adding unappealing bulk to the top of a vehicle.

Although not shown herein for purposes of brevity, additional modifications may be made to the overall structure and components of the active antenna system as described herein without departing from the spirit and scope of the aspects as described. For example, although the application of a TIM was described herein with respect to the contact between the active chip antennas and the mast. However, TIM may be applied to any suitable junction or contact between components where good thermal transfer is desirable. To provide an illustrative example, TIM may be applied to each surface associated with a thermal transition included within an active chip antenna (e.g., silicon package/antenna array board) and the mast, between the mast and heat pipes, between the heat pipes and the heat sinks, etc.

EXAMPLES

The following examples pertain to further aspects.

Example 1 is a thermal cooling system, comprising: a heatsink disposed within an environmentally-controlled region; a mast disposed outside of the environmentally-controlled region, the mast being coupled to a antenna circuitry; and one or more heat pipes coupled to the heatsink and the mast, the one or more heat pipes configured to provide a heat transfer between the mast and the heatsink to thermally regulate a temperature of one or more portions of the antenna circuitry.

In Example 2, the subject matter of Example 1, wherein the one or more heat pipes are coupled to the heatsink and the mast through a roof of a vehicle.

In Example 3, the subject matter of one or more of Examples 1-2, wherein the mast includes a plurality of faces.

In Example 4, the subject matter of one or more of Examples 1-3, wherein the antenna circuitry includes a plurality of antenna chips, and wherein the mast comprises a same number of the plurality of faces of the mast as a number of the plurality of antenna chips.

In Example 5, the subject matter of one or more of Examples 1-4, wherein each of the plurality of faces of the mast is coupled to a respective one of the plurality of antenna chips.

In Example 6, the subject matter of one or more of Examples 1-5, wherein the antenna circuitry includes a number of active antenna chips configured to facilitate communications for frequencies much above 6 GHz, including a range of 24 to 86 GHz.

In Example 7, the subject matter of one or more of Examples 1-6, wherein the antenna circuitry includes a number of active antenna chips having an associated junction temperature, and wherein the heat transfer between the heatsink and the mast regulates the associated junction temperature of the number of active antenna chips.

In Example 8, the subject matter of one or more of Examples 1-7, wherein the mast is comprised of a solid block of aluminum.

In Example 9, the subject matter of one or more of Examples 1-8, wherein each of the plurality of faces associated with the mast forms an about 15 degree angle with respect to the vertical direction relative to the heatsink.

In Example 10, the subject matter of one or more of Examples 1-9, wherein the one or more heat pipes include at least two heat pipes.

In Example 11, the subject matter of one or more of Examples 1-10, wherein the heatsink includes one or more fans to generate air flow through the heatsink using air from the environmentally-controlled region.

In Example 12, the subject matter of one or more of Examples 1-11, wherein the antenna circuitry includes a number of active antenna chips having an associated junction temperature, and wherein the one or more fans are turned on and off based upon the associated junction temperature associated with one or more of the number of active antenna chips.

Example 13 is a thermal cooling system, comprising: an internal heatsink disposed within a cab of a vehicle; an external mast disposed outside the cab of the vehicle, the external mast having a plurality of faces, with each face from among the plurality of faces being coupled to a respective one of a plurality of active antenna chips; and one or more heat pipes coupled to the internal heatsink and to the external mast, the one or more heat pipes configured to provide a heat transfer between the internal heatsink and the external mast to thermally regulate a temperature of one or more portions of the plurality of active antenna chips.

In Example 14, the subject matter of Example 13, wherein the one or more heat pipes are coupled to the internal heatsink and the external mast through a roof of the vehicle.

In Example 15, the subject matter of one or more of Examples 13-14, wherein each of the plurality of faces associated with the external mast forms an about 15 degree angle with respect to the vertical direction relative to the internal heatsink, and wherein the external mast comprises a same number of the plurality of faces of the external mast as a number of the plurality of active antenna chips.

In Example 16, the subject matter of one or more of Examples 13-15, wherein the plurality of active antenna chips are configured to facilitate communications for frequencies much greater than 6 GHz, including a range of 24 to 86 GHz.

In Example 17, the subject matter of one or more of Examples 13-16, wherein the heat transfer between the internal heatsink and the external mast regulates a junction temperature of the plurality of active antenna chips.

In Example 18, the subject matter of one or more of Examples 13-17, wherein the external mast is comprised of a solid block of aluminum.

In Example 19, the subject matter of one or more of Examples 13-18, wherein the one or more heat pipes include at least two heat pipes.

In Example 20, the subject matter of one or more of Examples 13-19, wherein: the internal heatsink includes one or more fans to generate an air flow through the internal heatsink using air within the cab of the vehicle, the plurality of active antenna chips have an associated junction temperature, and the one or more fans are turned on and off based upon the junction temperature associated with one or more of the plurality of active antenna chips.

Example 21 is a means for thermal cooling, comprising: a heatsink means disposed within an environmentally-controlled region; a mast means disposed outside of the environmentally-controlled region, the mast being coupled to a antenna circuitry means; and one or more heat pipe means coupled to the heatsink means and the mast means, the one or more heat pipe means providing a heat transfer between the mast means and the heatsink means to thermally regulate a temperature of one or more portions of the antenna circuitry means.

In Example 22, the subject matter of Example 21, wherein the one or more heat pipe means are coupled to the heatsink means and the mast means through a roof of a vehicle.

In Example 23, the subject matter of one or more of Examples 21-22, wherein the mast means includes a plurality of faces.

In Example 24, the subject matter of one or more of Examples 21-23, wherein the antenna circuitry means includes a plurality of antenna chip means, and wherein the mast means comprises a same number of the plurality of faces of the mast means as a number of the plurality of antenna chip means.

In Example 25, the subject matter of one or more of Examples 21-24, wherein each of the plurality of faces of the mast means is coupled to a respective one of the plurality of antenna chip means.

In Example 26, the subject matter of one or more of Examples 21-25, wherein the antenna circuitry means includes a number of active antenna chip means to facilitate communications for frequencies much above 6 GHz, including a range of 24 to 86 GHz.

In Example 27, the subject matter of one or more of Examples 21-26, wherein the antenna circuitry means includes a number of active antenna chip means having an associated junction temperature, and wherein the heat transfer between the heatsink and the mast means regulates the associated junction temperature of the number of active antenna chip means.

In Example 28, the subject matter of one or more of Examples 21-27, wherein the mast means is comprised of a solid block of aluminum.

In Example 29, the subject matter of one or more of Examples 21-28, wherein each of the plurality of faces associated with the mast means forms an about 15 degree angle with respect to the vertical direction relative to the heatsink means.

In Example 30, the subject matter of one or more of Examples 21-29, wherein the one or more heat pipe means include at least two heat pipe means.

In Example 31, the subject matter of one or more of Examples 21-30, wherein the heatsink means includes one or more fan means to generate air flow through the heatsink means using air from the environmentally-controlled region.

In Example 32, the subject matter of one or more of Examples 21-31, wherein the antenna circuitry means includes a number of active antenna chip means having an associated junction temperature, and wherein the one or more fan means are turned on and off based upon the associated junction temperature associated with one or more of the number of active antenna chip means.

Example 33 is a means for thermal cooling, comprising: an internal heatsink means disposed within a cab of a vehicle; an external mast means disposed outside the cab of the vehicle, the external mast means having a plurality of faces, with each face from among the plurality of faces being coupled to a respective one of a plurality of active antenna chips means; and one or more heat pipe means coupled to the internal heatsink means and to the external mast means, the one or more heat pipe means providing a heat transfer between the internal heatsink means and the external mast means to thermally regulate a temperature of one or more portions of the plurality of active antenna chip means.

In Example 34, the subject matter of Example 33, wherein the one or more heat pipe means are coupled to the internal heatsink means and the external mast means through a roof of the vehicle.

In Example 35, the subject matter of one or more of Examples 33-34, wherein each of the plurality of faces associated with the external mast means forms an about 15 degree angle with respect to the vertical direction relative to the internal heatsink means, and wherein the external mast means comprises a same number of the plurality of faces of the external mast means as a number of the plurality of active antenna chip means.

In Example 36, the subject matter of one or more of Examples 33-35, wherein the plurality of active antenna chip means are configured to facilitate communications for frequencies much greater than 6 GHz, including a range of 24 to 86 GHz.

In Example 37, the subject matter of one or more of Examples 33-36, wherein the heat transfer between the internal heatsink means and the external mast means regulates a junction temperature of the plurality of active antenna chip means.

In Example 38, the subject matter of one or more of Examples 33-37, wherein the external mast means is comprised of a solid block of aluminum.

In Example 39, the subject matter of one or more of Examples 33-38, wherein the one or more heat pipe means include at least two heat pipe means.

In Example 40, the subject matter of one or more of Examples 33-39, wherein: the internal heatsink means includes one or more fan means to generate an air flow through the internal heatsink means using air within the cab of the vehicle, the plurality of active antenna chip means have an associated junction temperature, and the one or more fan means are turned on and off based upon the junction temperature associated with one or more of the plurality of active antenna chip means.

An apparatus as shown and described.

A method as shown and described.

CONCLUSION

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processing circuitry" or "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processing circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A thermal cooling system, comprising:
   a heatsink disposed within an environmentally-controlled region;
   a mast disposed outside of the environmentally-controlled region, the mast being comprised of metal and coupled to antenna circuitry, the mast being distinct from the antenna circuitry and being in thermal contact with at least a portion of the antenna circuitry; and
   one or more heat pipes coupled to the heatsink and the mast, the one or more heat pipes configured to provide a heat transfer from the mast to the heatsink to thermally regulate a temperature of one or more portions of the antenna circuitry.

2. The thermal cooling system of claim 1, wherein the one or more heat pipes are coupled to the heatsink and the mast through a roof of a vehicle.

3. The thermal cooling system of claim 1, wherein the mast includes a plurality of faces, and wherein at least two of faces from among the plurality of faces are perpendicular to one another with respect to a central axis of the mast.

4. The thermal cooling system of claim 3, wherein the antenna circuitry includes a plurality of antenna chips, and wherein the mast comprises a same number of the plurality of faces of the mast as a number of the plurality of antenna chips.

5. The thermal cooling system of claim 4, wherein each of the plurality of faces of the mast is coupled to a respective one of the plurality of antenna chips.

6. The thermal cooling system of claim 3, wherein each of the plurality of faces associated with the mast forms an about 15 degree angle with respect to the vertical direction relative to the heatsink.

7. The thermal cooling system of claim 1, wherein the antenna circuitry includes a number of active antenna chips configured to facilitate communications for frequencies within a range of 24 to 86 GHz.

8. The thermal cooling system of claim 1, wherein the antenna circuitry includes a number of active antenna chips having an associated junction temperature, and
wherein the heat transfer between the heatsink and the mast regulates the associated junction temperature of the number of active antenna chips.

9. The thermal cooling system of claim 1, wherein the mast is comprised of a solid block of aluminum.

10. The thermal cooling system of claim 1, wherein the one or more heat pipes include at least two heat pipes.

11. The thermal cooling system of claim 1, wherein the heatsink includes one or more fans to generate air flow through the heatsink using air from the environmentally-controlled region.

12. The thermal cooling system of claim 11, wherein the antenna circuitry includes a number of active antenna chips having an associated junction temperature, and
wherein the one or more fans are turned on and off based upon the associated junction temperature associated with one or more of the number of active antenna chips.

13. A thermal cooling system, comprising:
an internal heatsink disposed within a cab of a vehicle;
an external mast disposed outside the cab of the vehicle, the external mast being comprised of metal and having a plurality of faces, with each face from among the plurality of faces being coupled to a respective one of a plurality of active antenna chips, the external mast being distinct from the plurality of active antenna chips and being in thermal contact with each respective one of the plurality of active antenna chips; and
one or more heat pipes coupled to the internal heatsink and to the external mast, the one or more heat pipes configured to provide a heat transfer from the external mast to the internal heatsink to thermally regulate a temperature of one or more portions of the plurality of active antenna chips.

14. The thermal cooling system of claim 13, wherein the one or more heat pipes are coupled to the internal heatsink and the external mast through a roof of the vehicle.

15. The thermal cooling system of claim 13, wherein each of the plurality of faces associated with the external mast forms an about 15 degree angle with respect to the vertical direction relative to the internal heatsink, and
wherein the external mast comprises a same number of the plurality of faces of the external mast as a number of the plurality of active antenna chips.

16. The thermal cooling system of claim 13, wherein the plurality of active antenna chips are configured to facilitate communications for frequencies within a range of 24 to 86 GHz.

17. The thermal cooling system of claim 13, wherein the heat transfer between the internal heatsink and the external mast regulates a junction temperature of the plurality of active antenna chips.

18. The thermal cooling system of claim 13, wherein the external mast is comprised of a solid block of aluminum.

19. The thermal cooling system of claim 13, wherein the one or more heat pipes include at least two heat pipes.

20. The thermal cooling system of claim 13, wherein:
the internal heatsink includes one or more fans to generate an air flow through the internal heatsink using air within the cab of the vehicle,
the plurality of active antenna chips have an associated junction temperature, and
the one or more fans are turned on and off based upon the junction temperature associated with one or more of the plurality of active antenna chips.

* * * * *